United States Patent [19]

Tatumi et al.

[11] Patent Number: 5,765,744
[45] Date of Patent: Jun. 16, 1998

[54] PRODUCTION OF SMALL METAL BUMPS

[75] Inventors: Kouhei Tatumi; Kenji Shimokawa; Eiji Hashino, all of Kawasaki, Japan

[73] Assignee: Nippon Steel Corporation, Tokyo, Japan

[21] Appl. No.: 678,474

[22] Filed: Jul. 9, 1996

[51] Int. Cl.$^6$ .............................. B23K 1/00; B23K 31/02
[52] U.S. Cl. ........................... 228/254; 228/253; 228/41; 228/19
[58] Field of Search .................... 228/246, 19, 41, 228/254, 253

[56] References Cited

U.S. PATENT DOCUMENTS

| | | | |
|---|---|---|---|
| 3,589,000 | 6/1971 | Galli | 228/253 |
| 5,172,853 | 12/1992 | Maiwald | 228/254 |
| 5,275,970 | 1/1994 | Itoh et al. | 228/254 |
| 5,289,631 | 3/1994 | Koopman et al. | 228/254 |

OTHER PUBLICATIONS

"Leveling Technique for Pads of Predeposited Solder," *IBM Tech. Discl. Bull.*, vol. 32, No. 1, Jun. 1989, pp. 50–51.
"Dimensional Control of Plated Wiring Board Surface Solder Deposits," (Anonymous), *Research Disclosure*, Jan. 1992, No. 333.

*Primary Examiner*—P. Austin Bradley
*Assistant Examiner*—Jeffrey T. Knapp
*Attorney, Agent, or Firm*—Pollock, Vande Sande & Priddy

[57] ABSTRACT

A process of producing small metal bumps includes the steps of simultaneously holding small metal balls on an arrangement baseplate in the positions corresponding to those of electrodes of a semiconductor chip, a film carrier, or a substrate; aligning the small metal balls held on the arrangement baseplate with the electrodes; lightly pressing the small metal balls against the electrodes; to provisionally fix the balls to the electrodes; and pressing the provisionally fixed small metal balls to flatten the pressed surfaces of the small metal balls, and at the same time, to bond the small metal balls to the electrodes.

6 Claims, 3 Drawing Sheets

PRODUCTION OF SMALL METAL BUMPS

BACKGROUND OF THE INVENTION

1. Field of the Invention

The present invention relates to a process and an apparatus for producing small metal bumps for packaging IC chips or other electronic devices.

2. Description of the Related Art

Semiconductor chips are advantageously bonded to electrodes of the inner leads of a film carrier or a substrate by using small metal bumps, particularly in multi-pin packaging or area packaging with a narrow bond pitch of 300 μm or less. Conventional processes for producing bumps include a wafer bump process which comprises a plating process and a stud bump process which comprises ball-bonding a wire and cutting the bonded wire at a neck portion.

Japanese Unexamined Patent Publication (Kokai) No. 7-153765 disclosed a small ball bump process, which is advantageous over the above-mentioned processes in mass-productivity and reliability. The small ball bump process comprises simultaneously holding small metal balls on an arrangement baseplate having suction holes in the positions corresponding to those of electrodes of a semiconductor chip, a film carrier, or a substrate, aligning the small metal balls held on the arrangement baseplate with the electrodes, and pressing the small metal balls to simultaneously bond the balls to the electrodes to form bumps. It is also disclosed that a semiconductor chip, a film carrier, or a substrate may be heated during pressing, in order to ensure good bonding between the balls and the electrodes.

The small ball bump process, however, has a problem in that, when the inner leads of a film carrier such as a TAB are pressed against the bumps formed in a semiconductor chip, for example, the inner leads are slipped or flow away the bumps because of rounded heads of the bumps. The use of an arrangement baseplate having suction holes has another problem in that, if the balls held by the suction holes are pressed against the bumps at an excessively high pressure, the balls are forced to intrude the suction holes, instead of being transferred onto the electrodes, and fail to produce bumps on the electrode and a lack of bumps occurs. To prevent the intrusion of the balls, the pressing pressure must be reduced and the bonding between the balls and the electrodes cannot be sufficient to prevent the bonded bumps from falling or dropping from the electrodes during conveying of the semiconductor chips or the like.

SUMMARY OF THE INVENTION

It is the object of the present invention to provide a process and an apparatus for producing small metal bumps, in which good bonding to the electrodes of a semiconductor chip, a film carrier, or a substrate is ensured, the bumps have a flat head, and the intrusion of the balls into the suction holes is prevented.

To achieve the object according to the present invention, there is provided a process of producing small metal bumps, comprising the steps of:

simultaneously holding small metal balls on an arrangement baseplate in the positions corresponding to those of electrodes of a semiconductor chip, a film carrier, or a substrate;

aligning the small metal balls held on the arrangement baseplate with the electrodes;

lightly pressing the small metal balls against the electrodes to provisionally fix the balls to the electrodes; and pressing the provisionally fixed small metal balls to flatten the pressed surfaces of the small metal balls, and at the same time, to bond the small metal balls to the electrodes.

There is also provided an apparatus for producing small metal bumps, comprising:

a mechanism for simultaneously holding small metal balls on an arrangement baseplate in the positions corresponding to those of electrodes of a semiconductor chip, a film carrier, or a substrate;

a mechanism for aligning the small metal balls held on the arrangement baseplate with the electrodes;

a mechanism for simultaneously lightly pressing the small metal balls against the electrodes to provisionally fix the balls to the electrodes; and a mechanism for pressing the provisionally fixed small metal balls to flatten the pressed surfaces of the small metal balls, and at the same time, to bond the small metal balls to the electrodes.

DESCRIPTION OF THE PREFERRED EMBODIMENTS

According to the present invention, small metal balls are simultaneously held on an arrangement baseplate in the positions corresponding to the electrodes of a semiconductor chip, a film carrier, or a substrate. The herein used term "electrode" includes "inner lead". The small metal balls held on the arrangement baseplate are then aligned with the electrodes, then simultaneously pressed lightly against the electrodes to provisionally fix the balls to the electrodes, and thereafter, the provisionally fixed balls are further pressed against the electrodes to flatten the surfaces of the balls being pressed, and at the same time, are thereby bonded to the electrodes.

The provisionally fixed small metal balls may be pressed against the electrodes by the arrangement baseplate. For example, when the small metal balls are held by suction on an arrangement baseplate having suction holes in the positions corresponding to those of the electrodes, after the balls are provisionally fixed to the electrodes, the suction holes of the arrangement baseplate may be shifted out of the positions of the provisionally fixed balls and other portions of the arrangement baseplate may be used to further press the balls to the electrodes. The thus-produced bumps are firmly bonded to the electrodes and do not drop from the electrodes during conveying. It is another advantage that the bumps have a flat head (or a pressed surface), and therefore, can be bonded to the TAB inner leads without occurrence of the misalignment, which occurred in the conventional small ball bump process because of the rounded bump head as recited hereinbefore. The bumps may have any shape so long as they have a flat head, which is flattened by pressing, and may have an elliptical cross-section or a barrel profile as shown FIG. 2.

Figure 4:
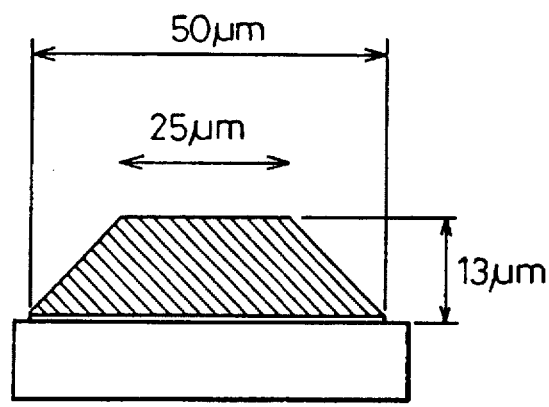
FIG. 4 shows a circular trapezoidal bump having a flat pressed head according to the present invention, in a cross-sectional view.

A press baseplate may be used to press the provisionally fixed small metal balls to bond the balls to the electrodes. The press baseplate may have a flat surface or have concavities 35 as shown in FIGS. 3(e) to 3(h). When an arrangement baseplate 34 having the concavities 35 is used, the small metal balls are deformed in accordance with the shape of the concavities 35 while being bonded to the electrodes without alignment. FIG. 4 shows a bump formed by using the press baseplate 34 having the concavities 35. The concavities 35 may have any shape so long as they provide a flat pressed head of the bumps formed on the electrodes. The concavities 35 may have the trapezoidal profile as shown in FIG. 4 and may be designed in accordance with the desired bump shape and size.

The small metal balls are lightly pressed against and provisionally fixed to the electrodes at a load of 1 to 30 g per ball. The provisional fixing of the balls to the electrodes is achieved by a slight deformation of the balls and the resulting weak bond to the electrodes. The provisionally fixed balls are then further pressed against and firmly bonded to the electrodes at a load of 10 to 100 g per ball. During the light pressing and the further pressing, a semiconductor chip, a film carrier, or a substrate may be heated at a temperature of 100° to 500° C. to allow the balls to be bonded to the electrodes at a smaller pressure or load and to improve the productivity. A semiconductor chip, a film carrier, or a substrate may be heated either by a separate heater means or by an arrangement baseplate or a press baseplate. During the light pressing and/or the further pressing, an ultrasonic vibration may also be used together with the heating to reduce the heating temperature and the pressing pressure while ensuring good bonding.

As in the conventional processes, the small metal ball bump process advantageously provides good bonding for an electrode pitch of 0.3 mm or less from the viewpoint of industrial manufacture. In this case, small metal balls having a diameter of 100 μm or less are used. When such balls are pressed to have a flat head, the produced bumps have a cylindrical columnar shape with a cross-sectional area of 150 μm or less and a height of 100 μm or less. The small metal balls having substantially the same diameters are used to provide a uniform height of the balls when arranged and held on an arrangement baseplate.

In the conventional stud bump process, a wire is cut to form bumps on the electrodes and the bumps are then pressed to provide a uniform bump height. The present invention, however, is not intended to provide a uniform bump height.

The small metal balls may have any composition so long as it provides an electric conductivity suitable for electrical terminals. Materials based on Au, Pt or other noble metals, materials based on Cu or Al, and solders or other low melting point metals or metal alloys, etc. may be used.

An arrangement baseplate and a press baseplate may be made of ceramics such as glass, alumina, boron nitride, silicon nitride, and silicon carbide, heat-resisting plastics, and metals such as stainless steel. A substrate having the electrodes on which the bumps are formed may be a printed circuit board made of glass epoxy, glass, ceramics, etc., or a flexible circuit board made of polyimide, etc.

The apparatus for carrying out the process according to the present invention is essentially composed of:

1) a mechanism for simultaneously holding small metal balls from a mounting container on an arrangement baseplate in the positions corresponding to those of electrodes by suction, electrostatic force, or magnetic force;

2) a mechanism for recognizing, by image analysis, etc., the positions of the small metal balls held on the arrangement baseplate and the positions of the electrodes and aligning the former with the latter;

3) a mechanism for simultaneously lightly pressing the small metal balls against the electrodes to provisionally fix the balls to the electrodes of a semiconductor chip, a film carrier, or a substrate; and 4) a mechanism for pressing, by the arrangement baseplate or a press baseplate, the provisionally fixed small metal balls to flatten the pressed surfaces of the small metal balls, and at the same time, to bond the small metal balls to the electrodes.

When the small metal balls have a reduced size, excess balls other than those to be transferred to the electrodes may occasionally be stuck to the arrangement baseplate or to the balls arranged and held on the arrangement baseplate. This phenomenon becomes significant when the balls have a size of 300 μm or less, particularly 150 μm or less. This phenomenon can be avoided by providing a means for removing excess balls by ultrasonic vibration (as disclosed in Japanese Unexamined Patent Publication (Kokai) No. 7-226425) in an arrangement head which holds an arrangement baseplate of a bump production apparatus of the present invention.

The mechanism for lightly pressing the small metal balls against the electrodes to provisionally fix the former to the latter has a pressure generating mechanism and may also form the mechanism for further pressing the provisionally fixed balls to the electrodes to firmly bond the former to the latter or may be a separate mechanism. Separate provision of these two mechanisms improves the apparatus throughput and the productivity.

The apparatus for producing small metal bumps may be integrated with a heating mechanism and an ultrasonic vibration application mechanism for facilitating the bump production, and may be integrated with a conveying mechanism for a semiconductor chip, a film carrier, or a substrate.

The process and apparatus of the present invention thus advantageously produce small metal bumps while preventing the bumps from falling from the electrodes and inner leads from flowing away from the bumps.

EXAMPLES

Example 1

FIG. 1(a) to 1(g) show a process sequence for producing small metal bumps according to the present invention. The process will be described in detail with reference to the drawings.

(a) Au-based small metal balls 11 having a diameter of 45 μm are simultaneously held on an arrangement baseplate 31. The arrangement baseplate 31 has suction holes 32 having a diameter of 30 μm, which is smaller than that of the balls, and the balls 11 are held at the suction holes 32 by suction from the back side of the arrangement baseplate 31.

(b) The arrangement baseplate 31 is moved to above a semiconductor chip 21 and the positions of the balls and the electrodes 22 are aligned with each other.

(c) The arrangement baseplate 31 with the balls 11 held thereon is lowered toward the chip 21 placed on a support 33 and the balls 11 are pressed against the electrodes 22 of the chip 21 at a load of 10 g per ball.

(d) After the balls 11 are simultaneously provisionally fixed to the electrodes 21, the arrangement baseplate 31 is raised. The provisionally fixed balls are denoted by "12".

(e) The arrangement baseplate 32 is displaced to right, thereby shifting the positions of the suction holes 32 out of the positions of the provisionally fixed balls 12.

(f) The arrangement baseplate 31 is lowered toward the provisionally fixed balls 12 to press the latter by flat portions of the arrangement baseplate 31 other than the suction holes 32 at a load of 30 g per ball.

(g) The arrangement baseplate 31 is raised away to leave small metal bumps 13 having a flat head shaped by the pressing on the electrodes 22 of the semiconductor chip 21.

Figure 1A:
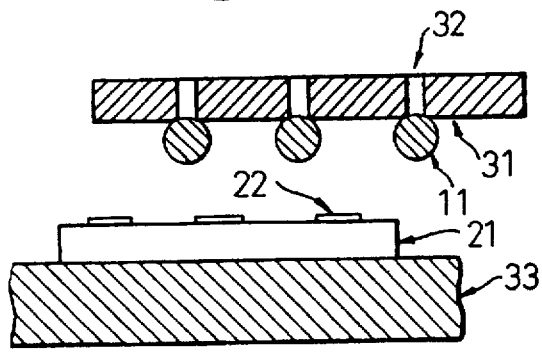
FIGS. 1(a) to 1(g) show a process sequence of producing small metal bumps according to the present invention, in cross-sectional views.
Figure 1E:
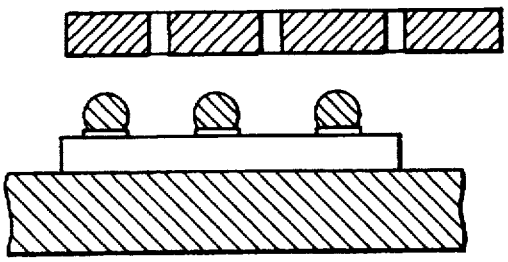
Figure 1B:
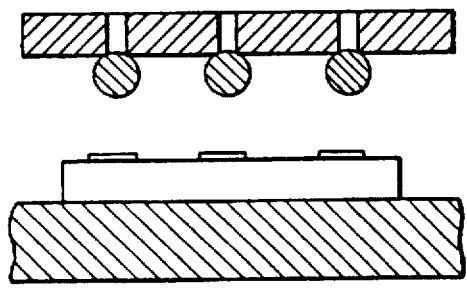
Figure 1F:
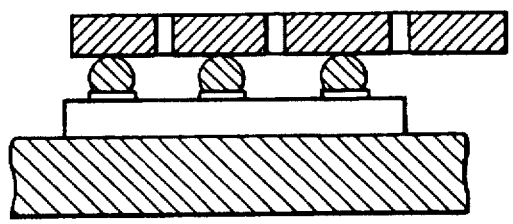
Figure 1C:
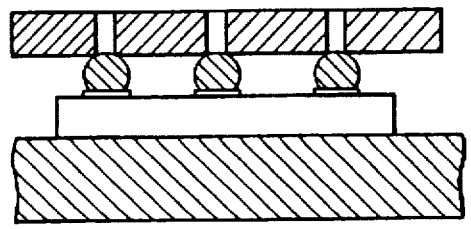
Figure 1G:
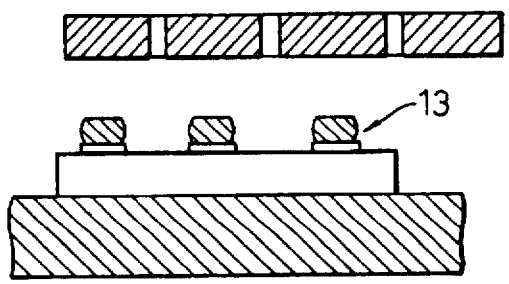
Figure 1D:
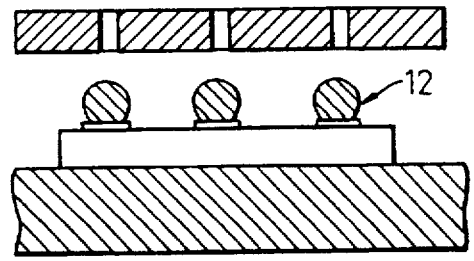
Figure 2:
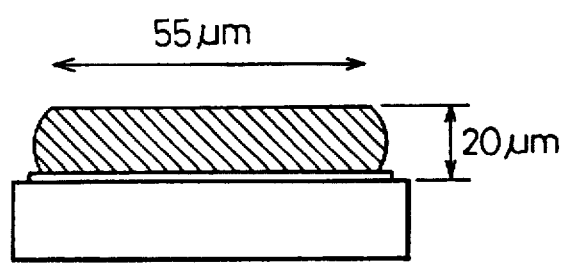
FIG. 2 shows a bump having a flat pressed head according to the present invention, in a cross-sectional view.

The semiconductor chip 21 is mounted on the support 33 and heated at 350° C. FIG. 2 shows one of the thus-produced small metal bumps 13 in a cross-sectional view. The bumps 13 have a barrel shape with a cross-diameter of 55 μm and a height of 20 μm. The bumps 13 form an Al—Au alloy with the Al of the electrodes, thereby providing strong bond to the electrodes without lack of bumps. The chip 21 having the thus-produced bumps thereon was conveyed with no dropping of the bumps. The chip 21 was bonded to the inner leads of a film carrier with no flowing down of the leads.

Example 2

Figure 3A:
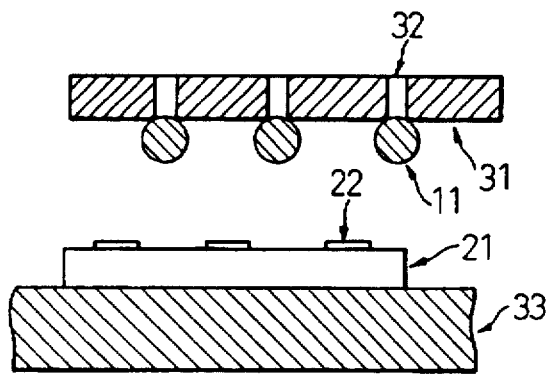
FIGS. 3(a) to 3(h) show another process sequence of producing small metal bumps according to the present invention, in cross-sectional views.
Figure 3E:
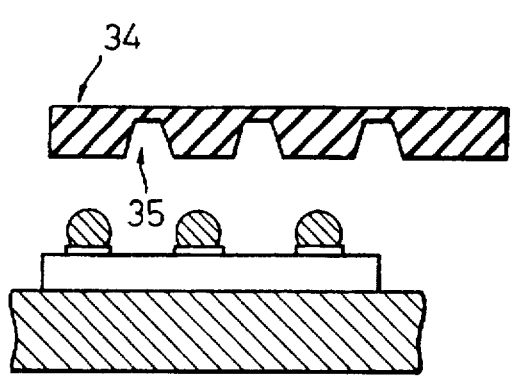
Figure 3B:
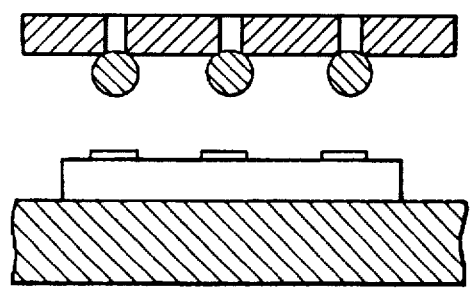
Figure 3F:
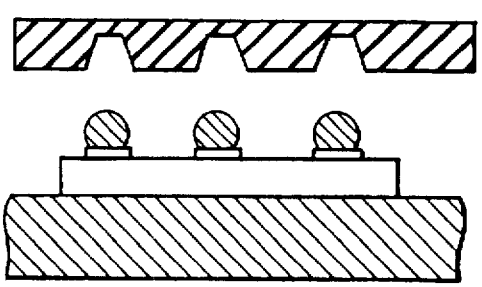
Figure 3C:
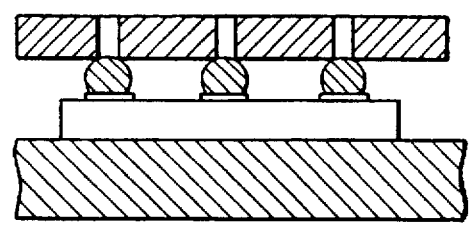
Figure 3G:
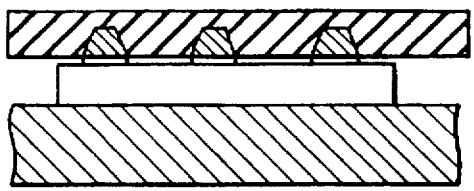
Figure 3D:
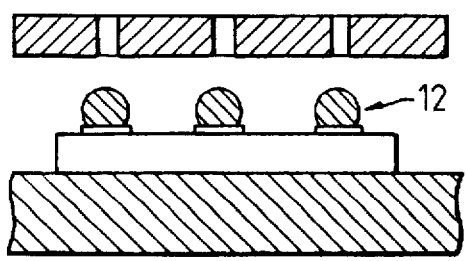
Figure 3H:
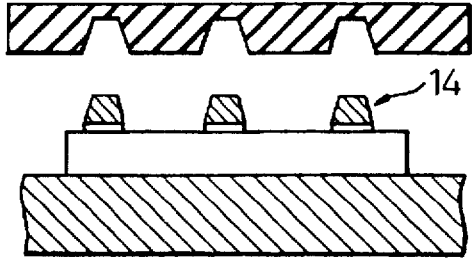

FIGS. 3(a) to 1(h) show another process sequence for producing small metal bumps according to the present invention. The process will be described in detail with reference to the drawings.

(a) Pt-based small metal balls 11 having a diameter of 50 μm are simultaneously held on an arrangement baseplate 31. The arrangement baseplate 31 has suction holes 32 having a diameter of 35 μm, which is smaller than that of the balls, and the balls 11 are held at the suction holes 32 by suction from back side of the arrangement baseplate 31.

(b) The arrangement baseplate 31 is moved to above a semiconductor chip 21 and the positions of the balls and the electrodes 22 are aligned with each other.

(c) The arrangement baseplate 31 with the balls 11 held thereon is lowered toward the chip 21 placed on a support 33 and the balls 11 are pressed against the electrodes 22 of the chip 21 at a load of 15 g per ball.

(d) After the balls 11 are simultaneously provisionally fixed to the electrodes 21, the arrangement baseplate 31 is raised away. The provisionally fixed balls are denoted by "12".

(e) A press baseplate 34 having concavities 35 is moved to above the provisionally fixed balls 12.

(f) The concavities 35 of the press baseplate 34 are aligned with the provisionally fixed balls 12.

(g) The press baseplate 34 is lowered to press the balls 12 at a load of 50 g per ball.

(h) The press baseplate 34 is raised away to leave circular trapezoidal bumps 14.

The semiconductor chip 21 is mounted on the support 33 and heated at 450° C. FIG. 4 shows one of the thus-produced circular trapezoidal small metal bumps 13 in a cross-sectional view. The bumps 14 have firmly bonded to all of the electrodes without a lack of bumps. The chip 21 having the thus-produced circular trapezoidal bumps 14 with a flat head thereon was conveyed with no dropping of the bumps. The chip 21 was bonded to the inner leads of a film carrier with no flowing down of the leads.

As herein described above, the present invention produces small bumps having a flat head formed by pressing and firmly bonded to the electrodes of a semiconductor chip, a film carrier, or a substrate. The thus-produced bumps prevent occurrence of the lack of bumps on the electrodes and flowing down of the leads from the bumps during bonding to a film carrier. The present invention allows packaging of miniaturized electronic devices having very small areas with an improved reliability and productivity.

We claim:

1. An apparatus for producing small metal bumps, comprising:

a mechanism for simultaneously holding small metal balls on an arrangement baseplate in the positions corresponding to those of electrodes of a semiconductor chip, a film carrier, or a substrate;

a mechanism for aligning the small metal balls held on the arrangement baseplate with the electrodes;

a mechanism for simultaneously lightly pressing the small metal balls against the electrodes to provisionally fix the balls to the electrodes; and a mechanism for pressing the provisionally fixed small metal balls to flatten the pressed surfaces of the small metal balls, and at the same time, to bond the small metal balls to the electrodes.

2. An apparatus for producing small metal bumps, comprising the steps of:

a mechanism for simultaneously holding small metal balls by suction on an arrangement baseplate having suction holes in the positions corresponding to those of electrodes of a semiconductor chip, a film carrier, or a substrate;

a mechanism for aligning the small metal balls held on the arrangement baseplate with the electrodes;

a mechanism for simultaneously lightly pressing the small metal balls against the electrodes to provisionally fix the balls to the electrodes; and a mechanism for pressing the provisionally fixed small metal balls by flat portions of the arrangement baseplate, which flat portions are different from the suction holes, to flatten the pressed surfaces of the small metal balls, and at the same time, to bond the small metal balls to the electrodes.

3. An apparatus for producing small metal bumps, comprising:

a mechanism for simultaneously holding small metal balls on an arrangement baseplate in the positions corresponding to those of electrodes of a semiconductor chip, a film carrier, or a substrate;

a mechanism for aligning the small metal balls held on the arrangement baseplate with the electrodes;

a mechanism for simultaneously lightly pressing the small metal balls against the electrodes to provisionally fix the balls to the electrodes; and a mechanism for pressing the provisionally fixed small metal balls by a press baseplate different from the arrangement baseplate, the press baseplate having concavities to flatten the pressed surfaces of the small metal balls, and at the same time, to bond the small metal balls to the electrodes.

4. A process of producing small metal bumps, comprising the steps of:

simultaneously holding small metal balls by suction on an arrangement baseplate having suction holes in the positions corresponding to those of electrodes of a semiconductor chip, a film carrier, or a substrate;

aligning the small metal balls held on the arrangement baseplate with the electrodes;

simultaneously lightly pressing the small metal balls against the electrodes to provisionally fix the balls to the electrodes; and pressing the provisionally fixed small metal balls by flat portions of the arrangement baseplate, which flat portions are different from the suction holes, to flatten the pressed surfaces of the small metal balls, and at the same time, to bond the small metal balls to the electrodes.

5. A process of producing small metal bumps, comprising the steps of:

simultaneously holding small metal balls on an arrangement baseplate in the positions corresponding to those of electrodes of a semiconductor chip, a film carrier, or a substrate;

aligning the small metal balls held on the arrangement baseplate with the electrodes;

lightly pressing the small metal balls against the electrodes to provisionally fix the balls to the electrodes; and pressing the provisionally fixed small metal balls to flatten the pressed surfaces of the small metal balls, and at the same time, to bond the small metal balls to the electrodes.

6. A process according to claim 5, wherein the step of pressing the small metal balls to bond the small metal balls to the electrodes is performed by pressing the small metal balls by a press baseplate other than the arrangement baseplate, the press baseplate having concavities.

* * * * *

UNITED STATES PATENT AND TRADEMARK OFFICE
CERTIFICATE OF CORRECTION

PATENT NO. : 5,765,744
DATED : June 16, 1998
INVENTOR(S) : Tatumi et al.

It is certified that error appears in the above-identified patent and that said Letters Patent is hereby corrected as shown below:

Title page, item [30], Foreign Application Priority Data should read:

Jul. 11, 1995  [JP]    Japan ...............7-175217

Signed and Sealed this

Twenty-fourth Day of November, 1998

Attest:

BRUCE LEHMAN

*Attesting Officer*    Commissioner of Patents and Trademarks